United States Patent [19]
Fujita

[11] Patent Number: 5,898,331
[45] Date of Patent: Apr. 27, 1999

[54] SEMICONDUCTOR MEMORY HAVING SIGNAL INPUT CIRCUIT OF SYNCHRONOUS TYPE

[75] Inventor: Mamoru Fujita, Tokyo, Japan

[73] Assignee: NEC Corporation, Tokyo, Japan

[21] Appl. No.: 09/014,579

[22] Filed: Jan. 28, 1998

[30] Foreign Application Priority Data

Jan. 28, 1997 [JP] Japan ................... 9-013587

[51] Int. Cl.$^6$ ........................... G06F 1/12
[52] U.S. Cl. ............... 327/296; 327/295; 327/291; 365/233; 365/230.08; 365/193
[58] Field of Search ................ 327/295, 296, 327/291, 165; 365/233, 230.08, 193

[56] References Cited

U.S. PATENT DOCUMENTS 5,768,213  6/1998  Jung et al. ................. 365/233
5,781,500  7/1998  Oh .............................. 365/233

FOREIGN PATENT DOCUMENTS 8-17182    1/1996  Japan.
8-180677   7/1996  Japan.

Primary Examiner—David Nelms
Assistant Examiner—Andrew Q. Tran
Attorney, Agent, or Firm—Sughrue, Mion, Zinn, Macpeak & Seas, PLLC

[57] ABSTRACT

External control signals are input to a semiconductor memory device via a synchronizing semiconductor circuit. An internal clock (ICLK) in the synchronizing semiconductor circuit is produced as a phase shifted version of an external clock (S11) which is input to the memory device. First latch circuits (321-324) latch external control signals in response to the external clock (S11). Decoder circuits ($331_0$-$331_n$) produce internal control signals ($S31_0$-$S331_n$) based upon the latched signals (S21-S24) output from the first latch circuits (321-324). Second latch circuits ($341_0$-$341_n$) latch the internal control signals ($S31_0$14 $S31_n$) in response to the internal clock signal (ICLK).

20 Claims, 10 Drawing Sheets

SEMICONDUCTOR MEMORY HAVING SIGNAL INPUT CIRCUIT OF SYNCHRONOUS TYPE

BACKGROUND OF THE INVENTION

The present invention relates to a semiconductor memory, and in particular, to a synchronous semiconductor memory having a signal input circuit.

A signal input system of a typical synchronous semiconductor memory such as a synchronous dynamic random access memory (DRAM) is shown in Japanese Laid-Open Patent Application No. 8-180677 (hereinafter, referred to as conventional example 1). In such a system, an internal clock signal is generated based upon a reference clock signal, which is input from the outside, and a clock enable signal for enabling or disabling the reference clock signal. All operations of the other synchronizing circuits in the semiconductor memory are synchronized with the internal clock signal and associated clock signals which are generated from the internal clock signal.

The process of receiving a command signal from the outside and generating an internal command signal that determines the internal operation is shown, for example, in Japanese Laid-Open Patent Application No. 8-17182 (hereinafter, referred to as conventional example 2).

FIG. 1 is a block diagram of a semiconductor circuit, used with a semiconductor memory shown in the conventional examples 1 and 2. FIG. 2 is a timing chart showing operation of the semiconductor circuit of FIG. 1. The semiconductor circuit of FIG. 1 is generally called a timing generator (TG).

In FIGS. 1 and 2, signals CLK, CKE, CSB, RASB, CASB and WEB are input from the outside. The signal CLK is an external reference clock signal, and all the operations of the internal circuits are synchronized with the leading edge of the signal CLK. The signal CKE is an external clock enable signal. When the level of the signal CKE is a logic low (or "non-active" state), no internal operation is performed for the next cycle following the rising edge of the signal CLK. The signals CSB, RASB, CASB and WEB are external command signals, namely, a chip select signal, a row address strobe signal, a column address strobe signal and a write enable signal, respectively. Internal operation of the memory is determined by a combination of signal levels of these signals when the signal CLK rises.

Receiver circuits 11-16 act as input buffers to convert voltage levels of each external input signal, such as the levels of low-voltage transistor-transistor logic (LVTTL), into corresponding internal signal voltage levels. Since each receiver circuit converts only the level, there is no logical difference between the input and the output.

An internal clock generating circuit 1 generates an internal reference clock signal ICLK based on the signal CLK and the signal CKE. The signal ICLK contains logical components of the signal CLK and the signal CKE, and the other internal circuits are operated synchronously with the internal clock signal ICLK.

Latch circuits 21-24 execute latching processing of respective external command signals based on the signal ICLK to control setup time and hold time of the external command signals with respect to the signal CLK. Delay circuits 53-56 regulate the setup time and the hold time. Since it takes much time for the internal clock generating circuit 1 to generate the signal ICLK from the signal CLK and the signal CKE and distribute it to each latch circuit 21-24, the delay circuits 53-56 cause a delay which corresponds to the delay time of circuit 1.

Command decoders $31_0$ through $31_n$ (n is a natural number) activate one of a plurality of respective internal command signals $S71_0$ through $S71_n$ (or inactivate all of them) which are latched as the combination of signals $S81_0$ through $S81_n$ output from respective latch circuits $41_0$ through $41_n$.

Since signals S61-S64 are input to the command decoders $31_0$ through $31_n$ through different paths, respective outputs of the command decoders $31_0$ through $31_n$ contain a hazard that may cause malfunction of the internal circuits to which the hazard is input. For this reason, the hazard is eliminated by means of the latch circuits $41_0$ through $41_n$.

The latch circuits $41_0$ through $41_n$ are driven by an internal clock delay signal (ICLKD). Since it takes some delay time for the command decoders $31_0$ through $31_n$ to generate the respective signals $S71_0$ through $S71_n$ from the signals S61-S64, the signal ICLKD is generated from the signal ICLK through a delay circuit 51 which provides a delay corresponding to the delay time of the command decoders $31_0$ through $31_n$.

The output signals $S81_0$ through $S81_n$ of the latch circuits $41_0$ through $41_n$ are internal command signals by which the internal operation of the synchronous DRAM is started.

The critical path for generation of the internal command signals $S81_0$ through $S81_n$ is as follows: The critical path starts from the CLK input, and passes through the receivers 11 and 12, the internal clock generating circuit 1, the latch circuits 21-24 and the command decoders $31_0$ through $31_n$, in that order, to reach the latch circuits $41_0$ through $41_n$ from which the internal command signals $S81_0$ through $S81_n$ are output.

However, such a conventional semiconductor circuit can not latch the external command signals until the internal clock signal ICLK is generated. For this reason, all the operations to be performed after command decoding are affected by the time lag of the internal clock generating circuit 1, and as a result, the access speed of the memory is low.

SUMMARY OF THE INVENTION

It is therefore an object of the present invention to provide a synchronous semiconductor memory capable of speeding up its operation to be started with input of external command signals and an external clock signal.

It is an other object of the present invention to provide a semiconductor circuit which has a reduced time delay from the input of the external clock signals until the generation of the internal command signals.

A semiconductor circuit of the present invention includes a first latch circuit for latching a first control signal in response to a first clock signal, as well as a first signal generator for producing a second clock signal based on the first clock signal. The semiconductor circuit also includes a second signal generator which responds to the first control signal latched by the first latch circuit by producing a second control signal. Also included in the semiconductor circuit is a second latch circuit for latching the second control signal in response to the second clock signal.

As a result of the above mentioned feature, external input signals are latched in accordance with a signal logically equal to an external input clock signal to control setup time and hold time of the external input signals. Subsequently, an internal clock generating circuit operates concurrently with command decoders. The present invention has a configuration in which internal command signals generated in the command decoders are released to other internal circuits in accordance with an internal clock signal generated in the internal clock generating circuit.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

A first embodiment of the present invention is described with reference to FIGS. 3 and 4.

Figure 1:
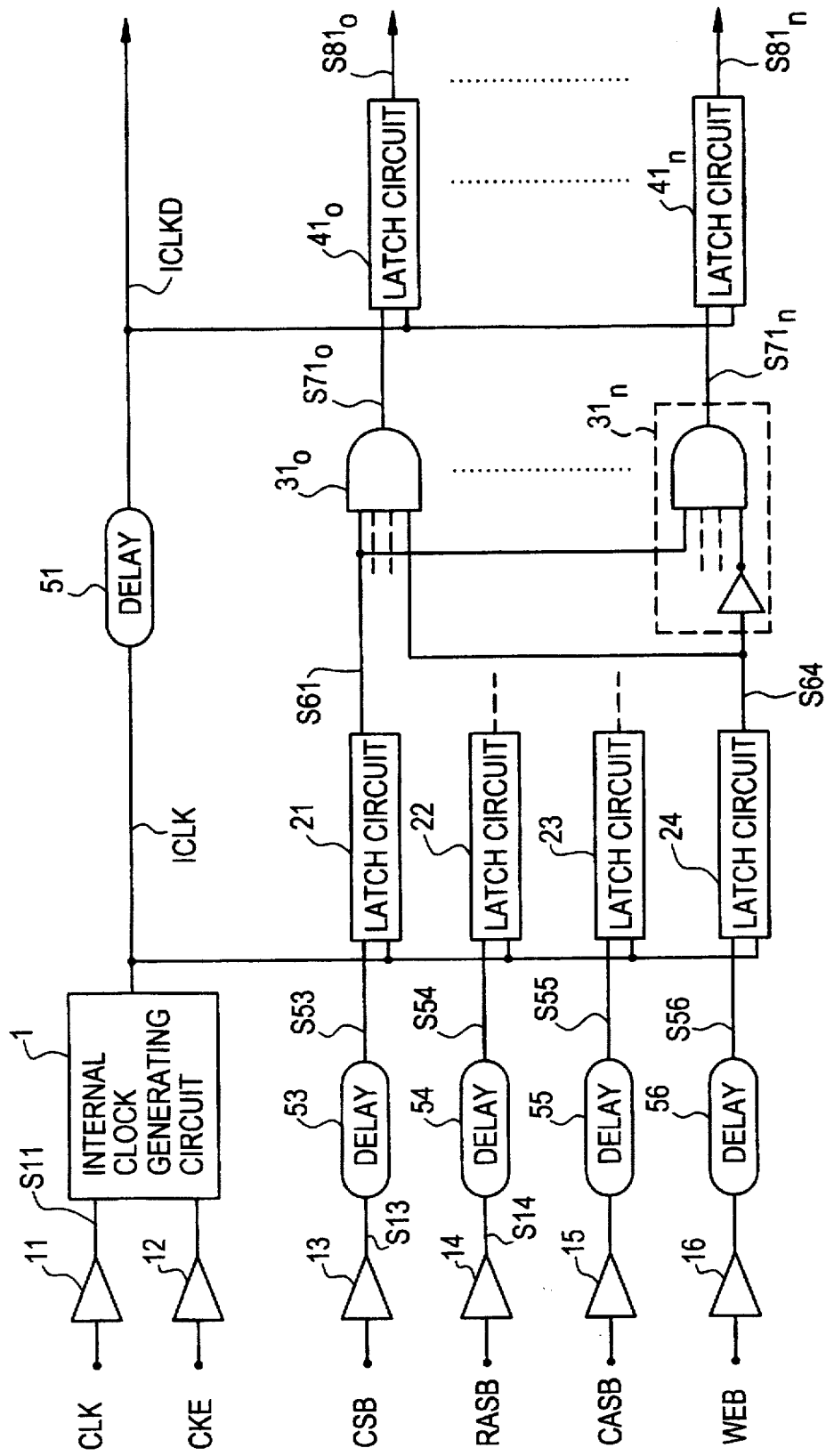
FIG. 1 is a block diagram showing a structure of a conventional semiconductor circuit.
Figure 2:
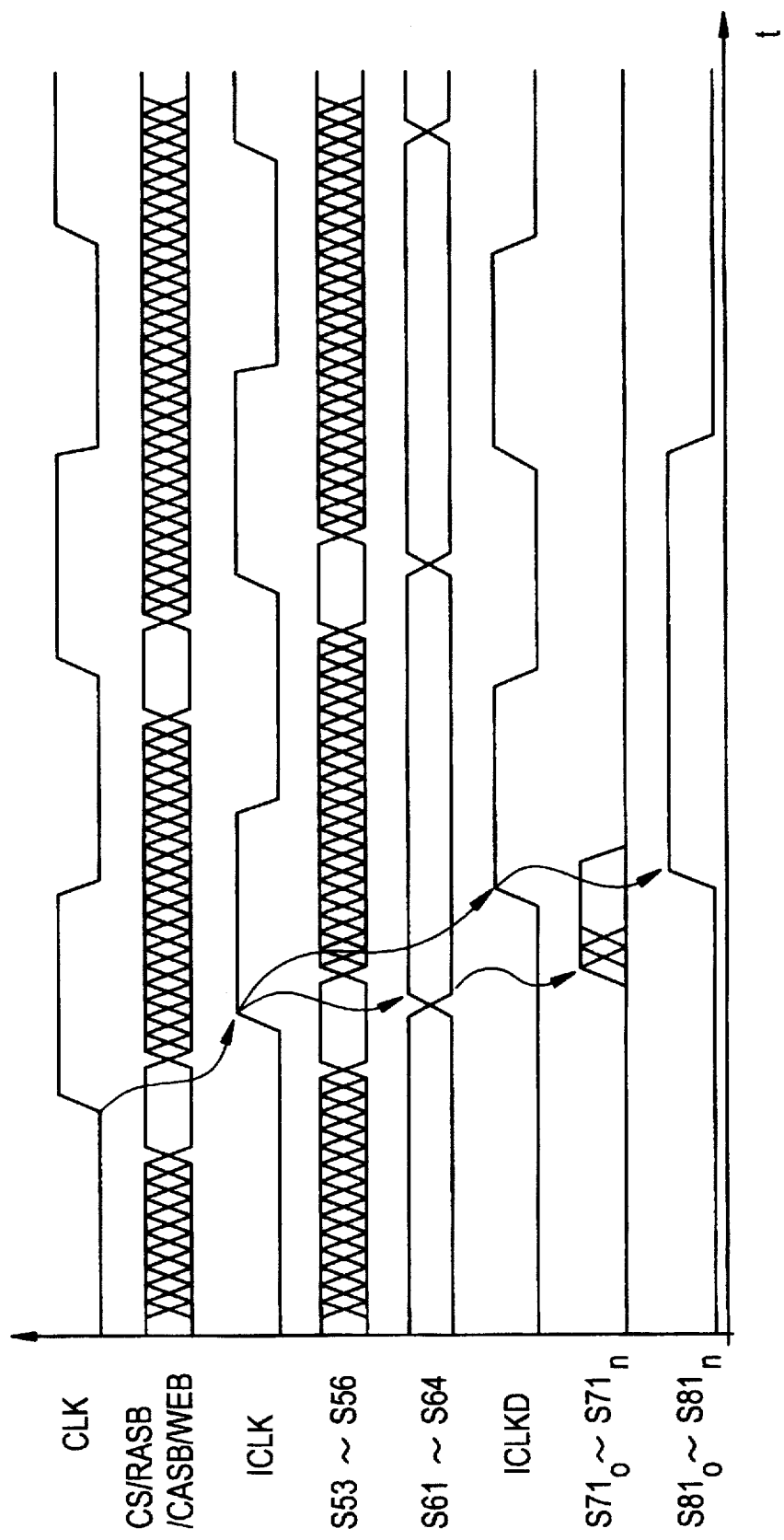
FIG. 2 is a wave form timing diagram showing operation of the semiconductor circuit of FIG. 1.
Figure 3:
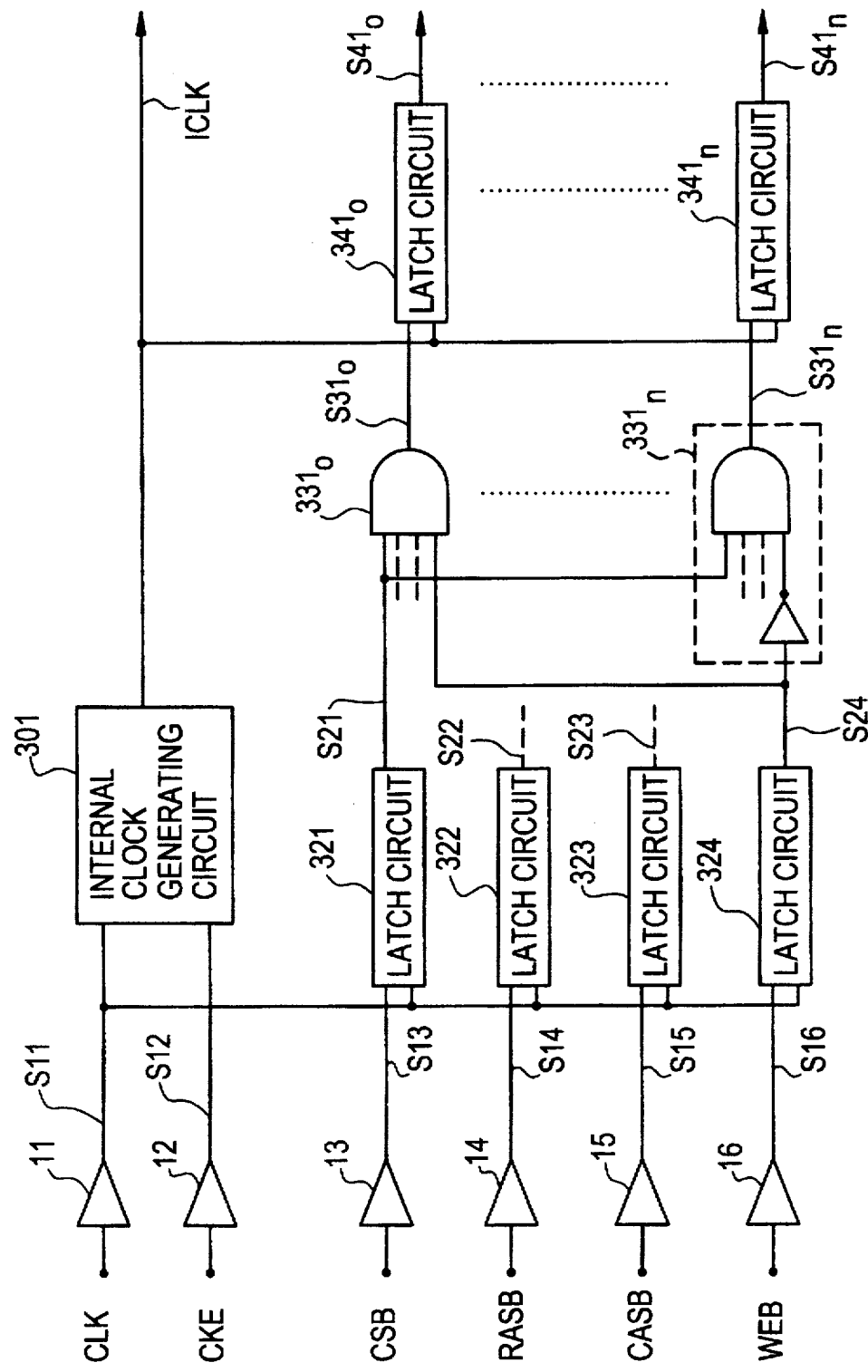
FIG. 3 is a block diagram showing a structure of a semiconductor circuit according to a first embodiment of the present invention.
Figure 4:
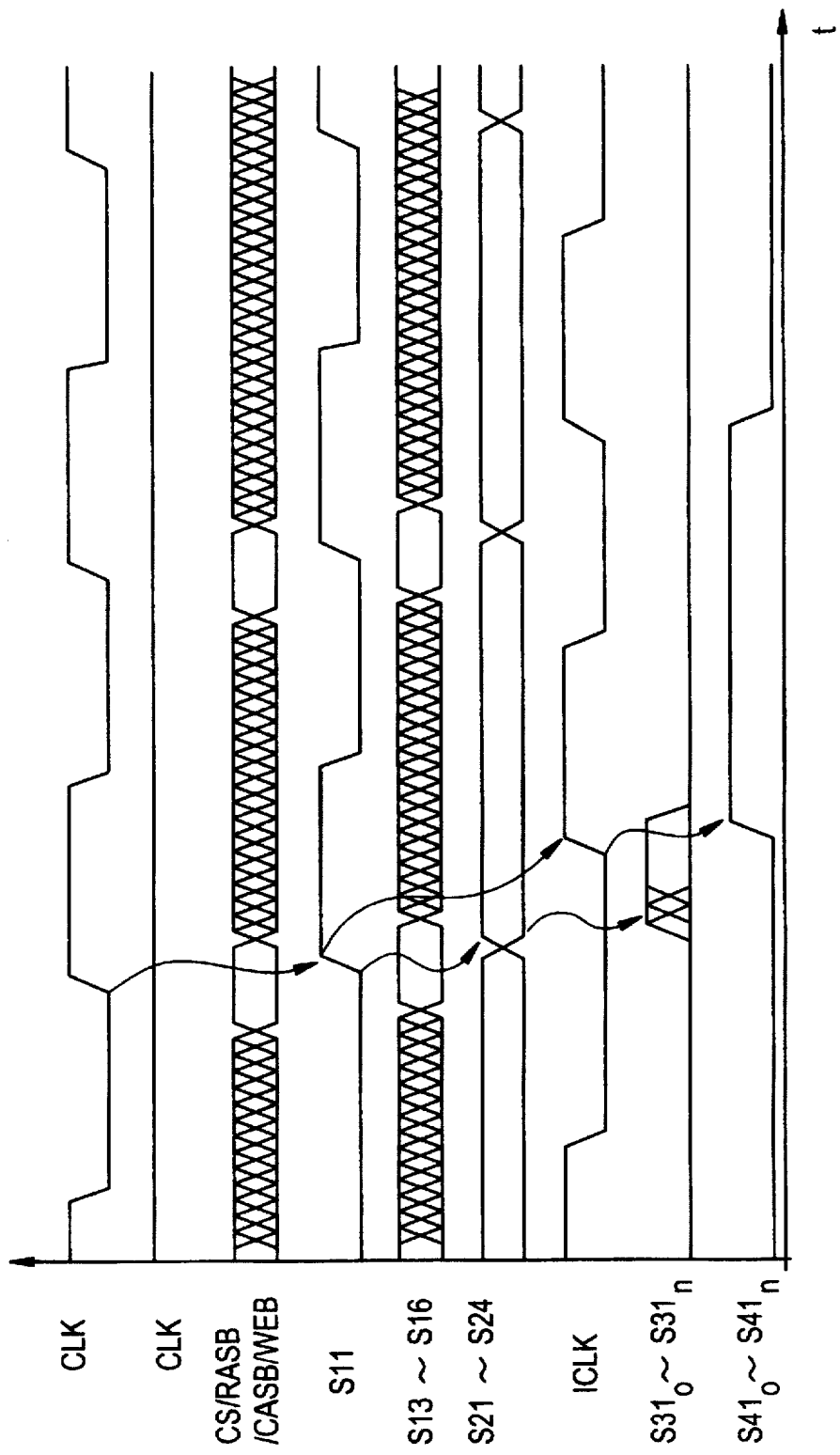
FIG. 4 is a wave form timing diagram showing operation of the semiconductor circuit of FIG. 3.

In FIGS. 3 and 4, signals CLK, CKE, CSB, RASB, CASB and WEB are input from the outside. The signal CLK is an external clock and signal CKE is an external clock enable. The other signals are command signals: a chip select signal CSB, a row address strobe signal RASB, a column address signal CASB, and a write enable signal WEB. Receiver circuits 11–16 act as input buffers to convert voltage levels of each external input signal into corresponding internal signal voltage levels.

Latch circuits 321–324 execute a latching function with respect to the external command signals in accordance with the signal CLK to control setup time and hold time of the external command signals to the signal CLK.

In this embodiment, the amount of delay required to regulate the setup time and the hold time is negligible, because the period of time for generation of a CLK input signal S11 is substantially equal to the period of time that elapses between the moment respective external command signals CSB, RASB, CASB, and WEB are input and the moment respective signals S13–S16 are generated.

An internal clock generating circuit 301 generates an internal reference clock signal ICLK based upon the external reference clock signal CLK and the external clock enable signal CKE.

Command decoders $331_0$ through $331_n$ activate one of a plurality of internal command signals $S31_0$ through $S31_n$ (or inactivate all of them) in accordance with the combination of signals S21–S24 output from latch circuits 321–324.

Since the internal clock generating circuit 301 and the command decoders $331_0$ through $331_n$ have different paths through which respective signals are input, outputs of the command decoders $331_0$ through $331_n$ contain a hazard. The hazard is eliminated by means of latch circuits $341_0$ through $41_n$. The latch circuits $341_0$ through $41_n$ outputs the command signals $S41_0$ through $S41_n$ which correspond to the command signals $S31_0$ through $S31_n$. The command signals $S41_0$ through $S41_n$ are, for example, a row address decoder control signal RG, a row address buffer control signal RL, a column decoder control signal CG, a column buffer control signal CL, a sense amplifier control signal PA, a write amplifier control signal WT, and a read amplifier control signal RA.

The first embodiment of the present invention differs from the conventional technique in that the latch circuits 321–324 are operated in accordance with only the logic of the signal CLK. As a result, the operations of the command decoders $331_0$ through $331_n$ will not stop even if the CKE is "non-active".

On the other hand, the latch circuits $341_0$ through $341_n$ are controlled by the signal ICLK consisting of logical components of the signals CLK and CKE. Therefore, when the signal CKE becomes "non-active", internal command signals $S41_0$ through $S41_n$ are not generated, and this is equivalent to a case where the signal CLK is ignored by the signal CKE.

According to the first embodiment of the present invention, the critical path for generation of the internal command signals $S41_0$ through $S41_n$ takes a longer way from the CLK input to the internal command signals $S41_0$ through $S41_n$ through the receivers 11 and 12, the internal clock generating circuit 1 and the latch circuits $341_0$ through $341_n$. Although the way is taken depending on the speed of each circuit element, the path is chosen to be shorter than in the conventional case. As a result, period of time for generation of internal commands from the CLK/CKE input is reduced.

Although the first embodiment described is a case where only the signals CLK and CKE are used for generation of the signal ICLK, the signal ICLK may be generated based on other signal input to the internal clock generating circuit 1, such as an internal signal indicative of a power saving mode, as long as the signals CLK and ICLK are different in logic.

Figure 5:
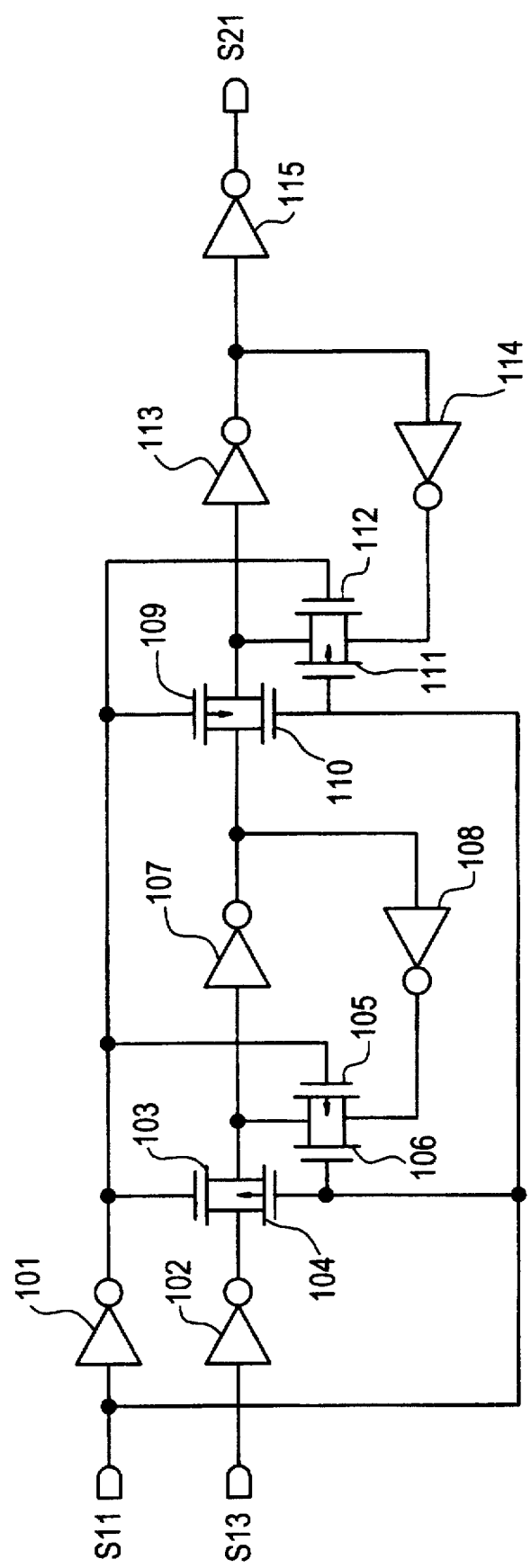
FIG. 5 is a circuit diagram showing a structure of the latch circuit 321 of FIG. 3.
Figure 6:
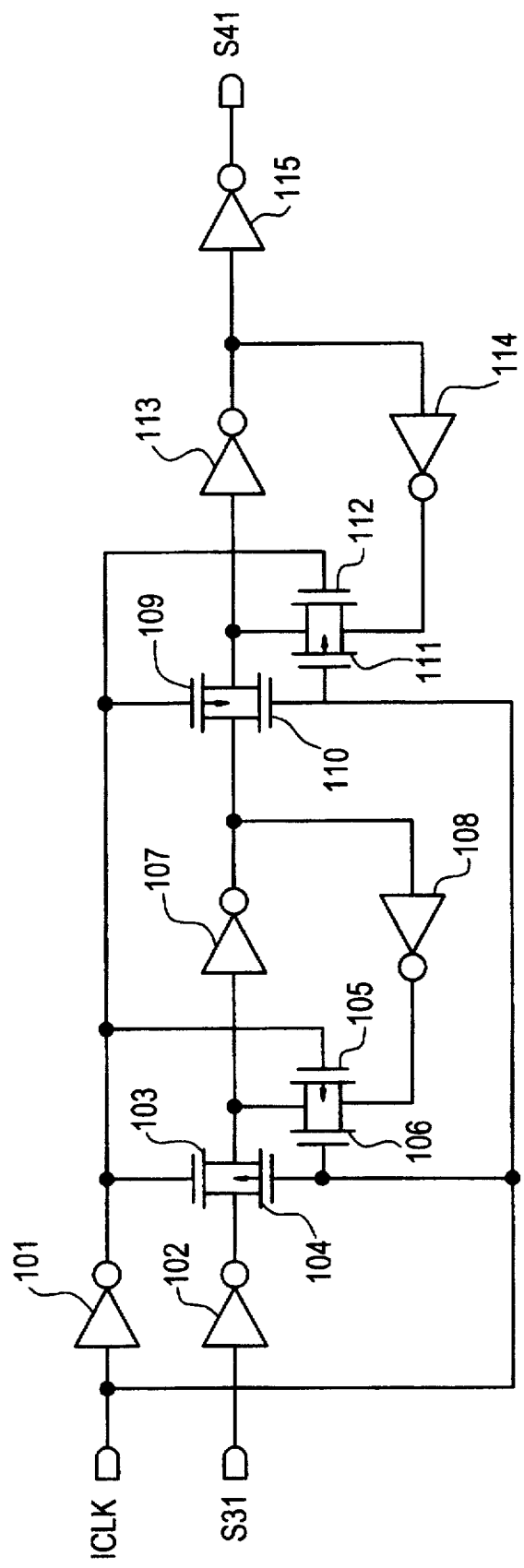
FIG. 6 is a circuit diagram showing a structure of the latch circuit 341 of FIG. 3.

FIGS. 5 and 6 show latch circuits 321 and 341, respectively. Since the circuit elements and their arrangement is the same in each of FIGS. 5 and 6 (though they have different signals at their respective input terminals and output terminals), an explanation is made about the circuit structure of FIG. 5, but is omitted with regard to FIG. 6, as such deal explanation would be redundant. Likewise, since each of the latch circuits 321–324 have the same structure except for the connections of their respective input terminals and output terminal, explanations of the structure of the latch circuits 322–324 are omitted as redundant to the description of latch circuit 321 shown in FIG. 5. Likewise, explanations of the structure of the latch circuits $341_0$ through $341_n$ are omitted as redundant since each of the latch circuits $341_0$ through $341_n$ have the same structure except for the connections of their respective input terminals and output terminals.

The latch circuit 321 is a master-slave type. The master portion comprises n channel Metal Oxide Silicon (hereinafter, referred to as nMOS) transistor 103, p channel Metal Oxide Silicon (hereinafter, referred to as pMOS)

transistor 104, pMOS transistor 105, nMOS transistor 106, inverter circuit 107, and inverter circuit 108. The slave portion comprises pMOS transistor 109, nMOS transistor 110, nMOS transistor 112, pMOS transistor 111, inverter circuit 113, and inverter circuit 114.

When the pair of nMOS transistor 103 and pMOS transistor 104 are activated, the pair of pMOS transistor 105 and nMOS transistor 106 is non-activated. As a result, data input at the input terminal S13 is transferred to an output terminal of inverter circuit 107. At that time, since the pair of pMOS transistor 109 and nMOS transistor 110 is non-activated, the data transferred to the output terminal of inverter circuit 107 is not transferred to the slave portion. Thereafter, when the pair of nMOS transistor 103 and pMOS transistor 104 becomes non-activated, the pair of pMOS transistor 105 and nMOS transistor 106 becomes activated. As a result, the data is maintained by the inverter circuits 107 and 108. On the other hand, when the pair of nMOS transistor 103 and pMOS transistor 104 becomes non-activated, the pair of pMOS transistor 109 and nMOS transistor 110 is activated and the pair of pMOS transistor 111 and nMOS transistor 112 is non-activated. As a result, the data is transferred to an output terminal S21. Then, when the pair of pMOS transistor 109 and nMOS transistor 110 is non-activated, the pair of pMOS transistor 111 and nMOS transistor 112 becomes activated so that the data transferred to the terminal S21 is maintained by the inverter circuits 113 and 114.

Figure 7:
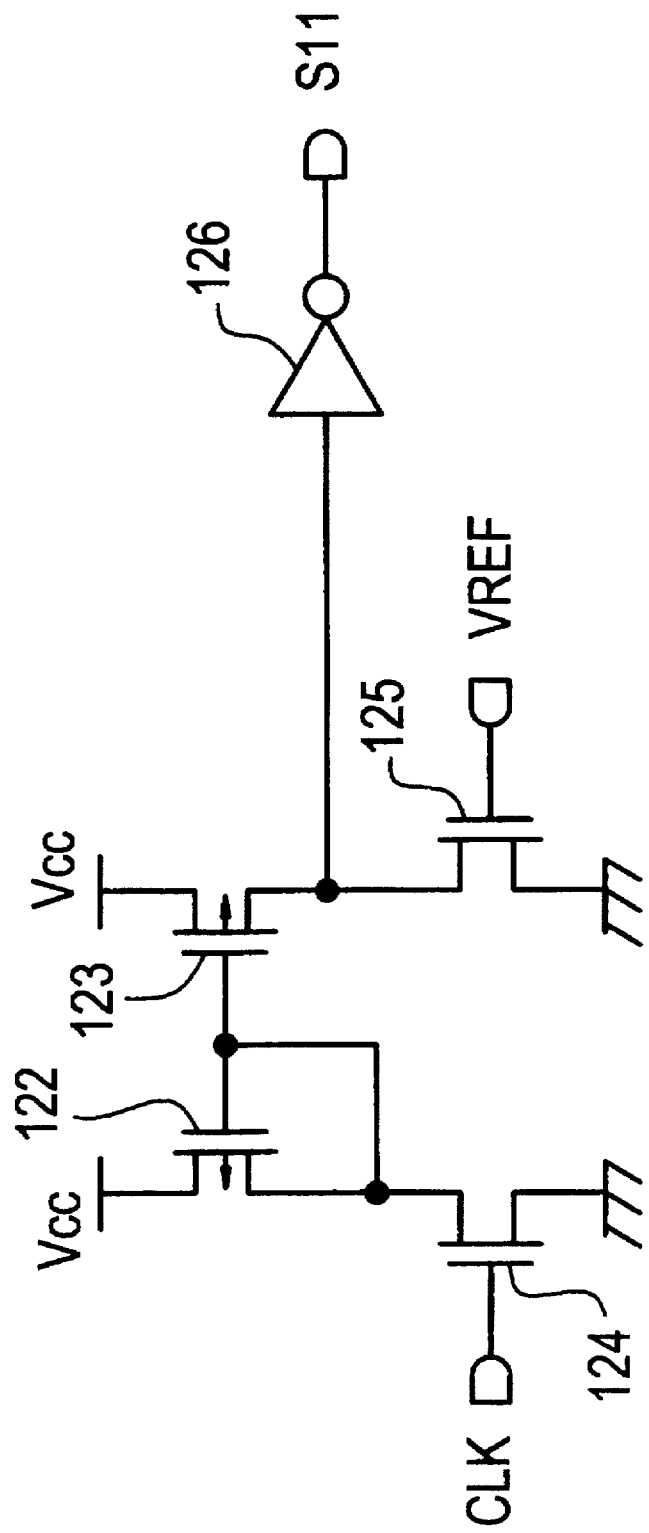
FIG. 7 is a circuit diagram showing an input buffer 11 of FIG. 3.

FIG. 7 shows a circuit diagram of the input buffer 11 shown in FIG. 3. The input buffer 11 is embodied as a current-mirror circuit. An nMOS transistor 124 is coupled between a ground source line and a first node and has a gate which receives the signal CLK as an input. A pMOS transistor 122 is coupled between a power source line and the first node and has a gate coupled to the first node. A pMOS transistor 123 is coupled between the power source line and a second node and has a gate coupled to the first node. A nMOS transistor 125 is coupled between the ground source line and the second node and has a gate receiving a reference voltage VREF. An inverter 126 has an input terminal connected to the second node and an output terminal connected to the signal line S11.

Since each of the input buffers 12–16 each have the same structure to the input buffer 11, detailed explanations of their structure are omitted as redundant. It is important to note, though, that since each of input buffers 11–16 have identical structure, their respective delay times are almost the same.

Figure 8:
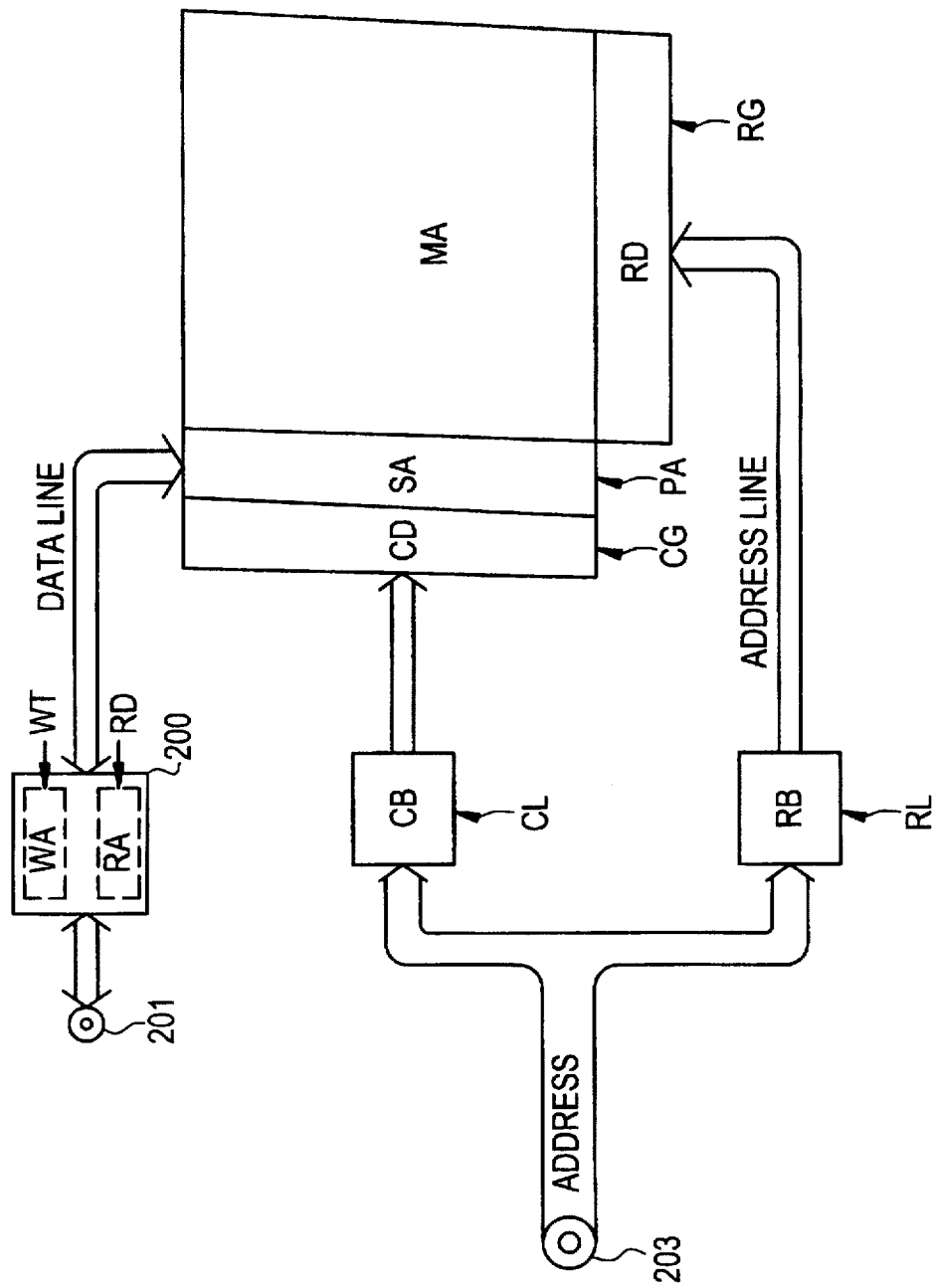
FIG. 8 is a block diagram showing a semiconductor memory device which uses signals produced with the semiconductor circuit according to a first embodiment of the present invention.

FIG. 8 shows a semiconductor memory device which uses command signals produced by the semiconductor circuit shown in FIG. 3.

The semiconductor memory device comprises a memory cell array MA, a row address decoder RD, a row address buffer RB, a sense amplifier SA, a column address decoder CD, a column address buffer CL, a data input and output circuit 200, a data input and output terminal 201, and an address input terminal 203.

The row address buffer PB latches a Y address signal through the address input terminal 203 to produce an internal Y address signal when the signal PL is activated. The row address decoder decodes the internal Y address signal to select one pair of bit lines among a plurality of pairs of bit lines in the memory cell array MA when the signal RG is activated. On the other hand, the column address buffer CB latches a X address signal through the address input terminal 203 to produce an internal X address signal when the signal CL is activated. The column address decoder decodes the internal Y address signal to select one word line among a plurality of word lines in the memory cell array MA when the signal RG is activated. The sense amplifier amplifies data transferred from a memory cell selected by the decoders RD and CD to output the data to data line when the signal PA is activated. Then, the read amplifier RD amplifies the data to output the data to the data input and output terminal 201 when the signal RD is activated. On the other hand, at the write operation mode, the write amplifier WA amplifies the data input to the input and output terminal 201, in order to transfer the data to the data line when the signal WT is activated. The sense amplifier amplifies the data when the signal PA is activated and the amplified data is written to a memory cell selected by the decoders CD and RD. The signals RG, PA, CG, RL, CL, WT, and RD are provided by means of the semiconductor circuit shown in FIG. 3.

Figure 9:
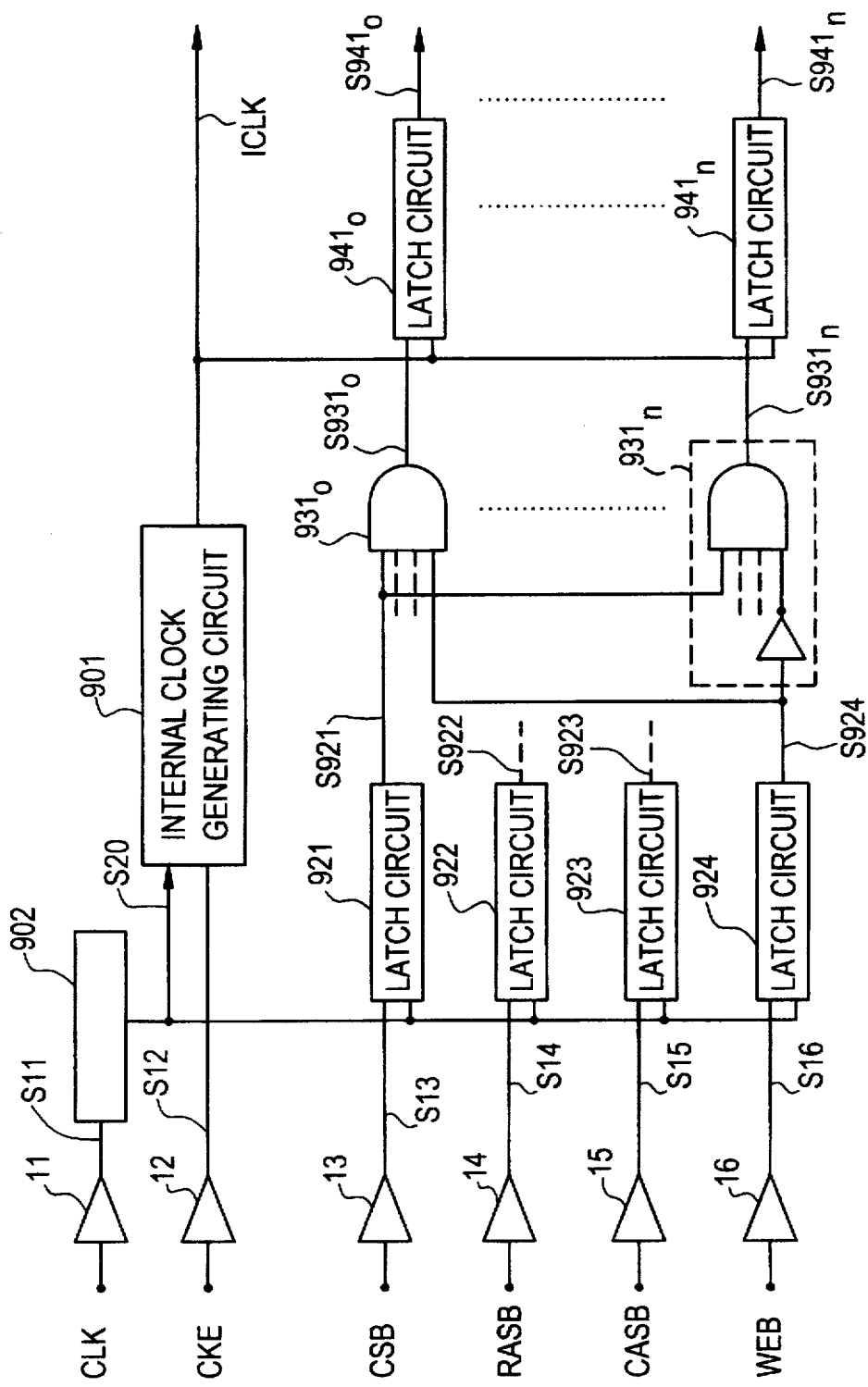
FIG. 9 is a block diagram showing a structure of a semiconductor circuit according to a second embodiment of the present invention.
Figure 10:
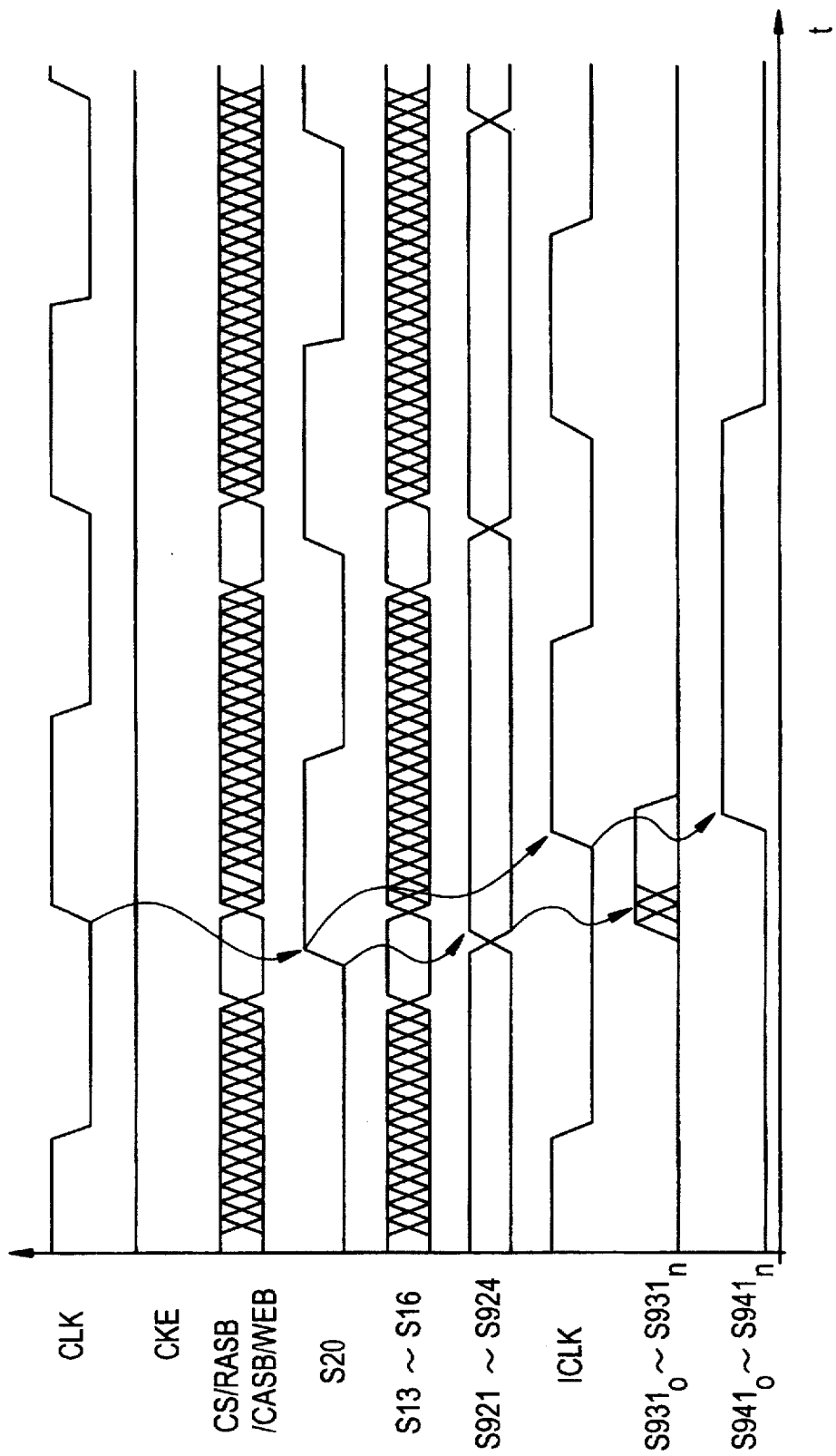
FIG. 10 is a wave form timing diagram showing operation of the semiconductor circuit of FIG. 9.

FIG. 9 is a block diagram showing a structure of a semiconductor circuit according to a second embodiment of the present invention, and FIG. 10 is a wave form timing diagram showing operation of the semiconductor circuit of FIG. 10.

A Phase Locked Loop (PLL) circuit 902 inputs an external clock signal CLK and outputs a signal having a frequency identical to the input signal CLK, but different in phase. In the second embodiment, it outputs a signal S20 which has an advanced phase.

Latch circuits 921–924 latch respective external command signals, based on the output S20 of the PLL circuit 2, so as to control setup time and hold time of the external command signals with respect to the CLK signal. The setup time and the hold time can be regulated by merely controlling the phase difference between the CLK input and the signal S20 based on period of time that elapses between the moment respective external command signals (CSB, RASB, CASB and WEB) are input and the moment signals S921–S924 are generated.

The PLL circuit 2 is able to freely make its input and output unequal in phase. Therefore, no delay circuit needs to be provided in the path for generation of signals S13–S16 from input of respective external command signals.

An internal clock generating circuit 901 generates an internal reference clock signal ICLK from the signal S20 and the CKE signal. The internal clock generating circuit 901 and the command decoders $931_0$ through $931_n$ do not need to use the output from the other side, and thus, they can be operated completely in parallel with each other.

Beyond the above explanation of the second embodiment of the present invention, no further explanation is made since the structure and operation of the portions of the second embodiment, besides that explained above, is the same to the structure and operation of the first embodiment of the present invention.

According to the second embodiment, since the phase of the signal S20 controlling the latch circuits 921–924 can be freely selected, setup time and hold time of the signals S13–S16 can be freely tailored to the signal S20, irrespective of the standards of setup time and hold time of the external command signals to the CLK signal. For this reason, the critical path for generation of the internal command signals $S941_0$ through $S941_n$ is substantially as follows: It starts from input of the external command signals CSB, RASB, CASB and WEB to the receivers 13–16, and the signal S12 to the receiver 12, and passes through the latch circuits 921–924 and the command decoders $931_0$ through $931_n$ on its way to the latch circuits $941_0$ through $941_n$ from which the internal command signals $S941_0$ through $S941_n$ are output.

In such a structure, the external command signals are latched ahead of the signal CLK by each setup time, so that generation of the internal command signal is speeded up.

Although the second embodiment described a case where the PLL circuit is used for generation of the signal S20, other circuits, such as a DLL circuit, may be used instead as long as the circuit used has the same function.

As described above, the present invention provides a synchronous semiconductor memory capable of speeding up its operations which are to be started based upon external command signal inputs and an external clock signal input.

It is apparent that the present invention is not limited to the above embodiments but may be modified and changed without departing from the scope and spirit of the invention.

What is claimed is:

1. A semiconductor circuit comprising:
   a first latch which receives as an input a first control signal to be latched in response to a first clock signal and which outputs a latched first control signal;
   a first signal generator which receives as an input said first clock signal and which outputs a second clock signal based on said first clock signal;
   a second signal generator which receives as an input said latched first control signal and which outputs a second control signal based on said latched first control signal; and
   a second latch which receives as an input said second control signal to be latched in response to said second clock signal.

2. The semiconductor circuit as claimed in claim 1, wherein said first clock signal is an external clock signal.

3. The semiconductor circuit as claimed in claim 2, wherein said second clock signal is an internal clock signal.

4. The semiconductor circuit as claimed in claim 3, wherein said first control signal is an external command signal and said second control signal is an internal command signal.

5. The semiconductor circuit as claimed in claim 4, wherein said second signal generator is a decoder circuit.

6. The semiconductor circuit as claimed in claim 1, wherein said first clock signal is inputted through a first input buffer to said first signal generator, said first control signal is inputted through a second input buffer to said second signal generator, and said first input buffer and said second input buffer are each comprised of structures which are essentially the same as one another.

7. The semiconductor circuit as claimed in claim 1, wherein said first clock signal is a signal having a frequency identical to and different in phase from an external clock signal.

8. A semiconductor circuit comprising:
   first latch means for latching a plurality of external input signals in synchronization with a first clock signal;
   means for generating an internal control signal based on the combination of said external input signals; and
   second latch means for latching the internal control signal in synchronization with a second clock signal different from said first clock signal.

9. The circuit as claimed in claim 8, wherein said second clock signal is produced by a clock generator receiving said first clock signal.

10. The circuit as claimed in claim 9, wherein said first clock signal is inputted through a first input buffer to said clock generator, said external input signal is inputted through a second input buffer to said first latch means and each of said first and second input buffers are of the same structure to each other.

11. The circuit as claimed in claim 10, wherein said first clock signal is an external clock signal and said second clock signal is an internal clock signal produced from said external clock signal.

12. The circuit as claimed in claim 8, wherein said first clock signal is a signal having a frequency identical to and different in phase from an external clock signal and said second clock signal is an internal clock signal produced from said external clock signal.

13. A semiconductor circuit comprising:
   a first input buffer having an input terminal receiving an external clock signal and an output terminal;
   a second input buffer having an input terminal receiving a clock enable signal and an output terminal;
   a plurality of third input buffers each having an input terminal receiving an external command signal and an output terminal;
   an internal clock generating circuit having an input terminal coupled to said output terminals of said first and second input buffers and an output terminal for outputting an internal clock signal;
   a plurality of first latch circuits each having an input terminal coupled to said output terminal of said first input buffer and the respective third input buffer and each having an output terminal;
   a plurality of logic circuits each having an input terminal coupled to at least one output terminal of said first latch circuits and each having an output terminal; and
   a plurality of second latch circuit each having an input terminal coupled to said output terminal of said internal clock generating circuit and said output terminal of the respective logic circuit.

14. The circuit as claimed in claim 13, wherein said first input buffer, said second input buffer, and said plurality of third input buffers are each comprised of structures which are essentially the same as one another.

15. A semiconductor circuit comprising:
   a first input buffer having an input terminal receiving an external clock signal and an output terminal;
   a second input buffer having an input terminal receiving a clock enable signal and an output terminal;
   a phase shift circuit having an input terminal coupled to said output terminal of said first input buffer and having an output terminal for outputting a signal having a frequency identical to and different in phase from said external clock signal;
   a plurality of third input buffers each having an input terminal receiving an external command signal and each having an output terminal;
   an internal clock generating circuit having an input terminal coupled to said output terminals of said second input buffer and said phase shift circuit and having an output terminal for outputting an internal clock signal;
   a plurality of first latch circuits each having an input terminal coupled to said output terminals of the respective third input buffer and said phase shift circuit and each having an output terminal;
   a plurality of logic circuits each having an input terminal coupled to at least one output terminal of said first latch circuits and each having an output terminal; and
   a plurality of second latch circuits each having an input terminal coupled to said output terminals of said internal clock generating circuit and the respective logic circuit.

16. The circuit as claimed in claim 15, wherein said phase shift circuit is a phase locked loop circuit.

17. The circuit as claimed in claim 16, wherein said first input buffer, said second input buffer, and said plurality of third input buffers are each comprised of structures which are essentially the same as one another.

18. A method for producing an internal command signal comprising the steps of:

latching an external command signal;

producing an internal clock signal based on an external clock signal, and said internal command signal based on a latched external command signal; and latching said internal command signal in response to said internal clock signal;

wherein said external command signal is latched before said internal clock signal is produced.

19. The method as claimed in claim 18, wherein said external command signal is latched in synchronism with said external clock signal.

20. The method as claimed in claim 19, wherein said internal clock signal and said internal command signal are produced in parallel.

* * * * *